(12) United States Patent
Kim et al.

(10) Patent No.: US 8,178,887 B2
(45) Date of Patent: *May 15, 2012

(54) SEMICONDUCTOR LIGHT EMITTING DEVICE AND METHOD FOR MANUFACTURING THE SAME

(75) Inventors: Tae Yun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/004,758

(22) Filed: Jan. 11, 2011

(65) Prior Publication Data
US 2011/0101415 A1    May 5, 2011

Related U.S. Application Data

(63) Continuation of application No. 12/659,208, filed on Mar. 1, 2010, now Pat. No. 7,888,693, which is a continuation of application No. 12/198,728, filed on Aug. 26, 2008, now Pat. No. 7,700,961.

(30) Foreign Application Priority Data

Aug. 28, 2007    (KR) .......................... 10-2007-0086711

(51) Int. Cl.
*H01L 33/00* (2010.01)

(52) U.S. Cl. .............. 257/94; 257/96; 257/97; 257/102; 257/E33.029

(58) Field of Classification Search ................... 257/94, 257/96, 97, 102, E33.029
See application file for complete search history.

(56) References Cited

U.S. PATENT DOCUMENTS

| 7,888,693 | B2 * | 2/2011 | Kim et al. ...................... 257/94 |
| 2009/0072254 | A1 | 3/2009 | Chakraborty |
| 2009/0108276 | A1 | 4/2009 | Tu et al. |
| 2009/0166606 | A1 | 7/2009 | Lee |
| 2009/0166649 | A1 | 7/2009 | Lee |
| 2010/0032694 | A1 | 2/2010 | Kim et al. |
| 2011/0001123 | A1 * | 1/2011 | Kim et al. ...................... 257/13 |

* cited by examiner

*Primary Examiner* — Ngan Ngo
(74) *Attorney, Agent, or Firm* — Birch, Stewart, Kolasch & Birch, LLP

(57) ABSTRACT

Provided is a semiconductor light emitting device and a method for manufacturing the same. The semiconductor light emitting device comprises: a first conductive type semiconductor layer; an active layer on the first conductive type semiconductor layer; an undoped semiconductor layer on the active layer; a first delta-doped layer on the undoped semiconductor layer; and a second conductive type semiconductor layer on the first delta-doped layer.

5 Claims, 6 Drawing Sheets

SEMICONDUCTOR LIGHT EMITTING DEVICE AND METHOD FOR MANUFACTURING THE SAME

CROSS-REFERENCE TO RELATED APPLICATIONS

The present application is a Continuation of application Ser. No. 12/659,208, filed on Mar. 1, 2010 now U.S. Pat. No. 7,888,693, which is a Continuation of application Ser. No. 12/198,728, filed on Aug. 26, 2008 (now U.S. Pat. No. 7,700,961), which claims priority under 35 U.S.C. §119 of Korean Patent Application No. 10-2007-0086711 (filed on Aug. 28, 2007), which are hereby incorporated by reference in their entireties.

BACKGROUND

The present disclosure relates to a semiconductor light emitting device and a method of manufacturing the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device comprising an undoped semiconductor layer and a delta-doped layer on an active layer, and a method for manufacturing the same.

Embodiments provide a semiconductor light emitting device comprising an undoped semiconductor layer and at least two delta-doped layers on an active layer, and a method for manufacturing the same.

Embodiments provide a semiconductor light emitting device and a method for manufacturing the same that can improve the conductivity and crystallinity of a second conductive type semiconductor layer by forming a delta-doped layer using a second conductive type dopant.

An embodiment provides a semiconductor light emitting device comprising: a first conductive type semiconductor layer; an active layer on the first conductive type semiconductor layer; an undoped semiconductor layer on the active layer; a first delta-doped layer on the undoped semiconductor layer; and a second conductive type semiconductor layer on the first delta-doped layer.

An embodiment provides a semiconductor light emitting device comprising: a first conductive type semiconductor layer; an active layer on the first conductive type semiconductor layer; an undoped semiconductor layer on the active layer; and a second conductive type semiconductor layer comprising a delta-doped layer on the undoped semiconductor layer.

An embodiment provides a method for manufacturing a semiconductor light emitting device comprising: forming a first conductive type semiconductor layer; forming an active layer on the first conductive type semiconductor layer; forming an undoped semiconductor layer on the active layer; forming a first delta-doped layer on the undoped semiconductor layer; and forming a second conductive type semiconductor layer on the first delta-doped layer.

The details of one or more embodiments are set forth in the accompanying drawings and the description below. Other features will be apparent from the description and drawings, and from the claims.

DETAILED DESCRIPTION OF THE EMBODIMENTS

A semiconductor light emitting device and a method for manufacturing the same according to an embodiment will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
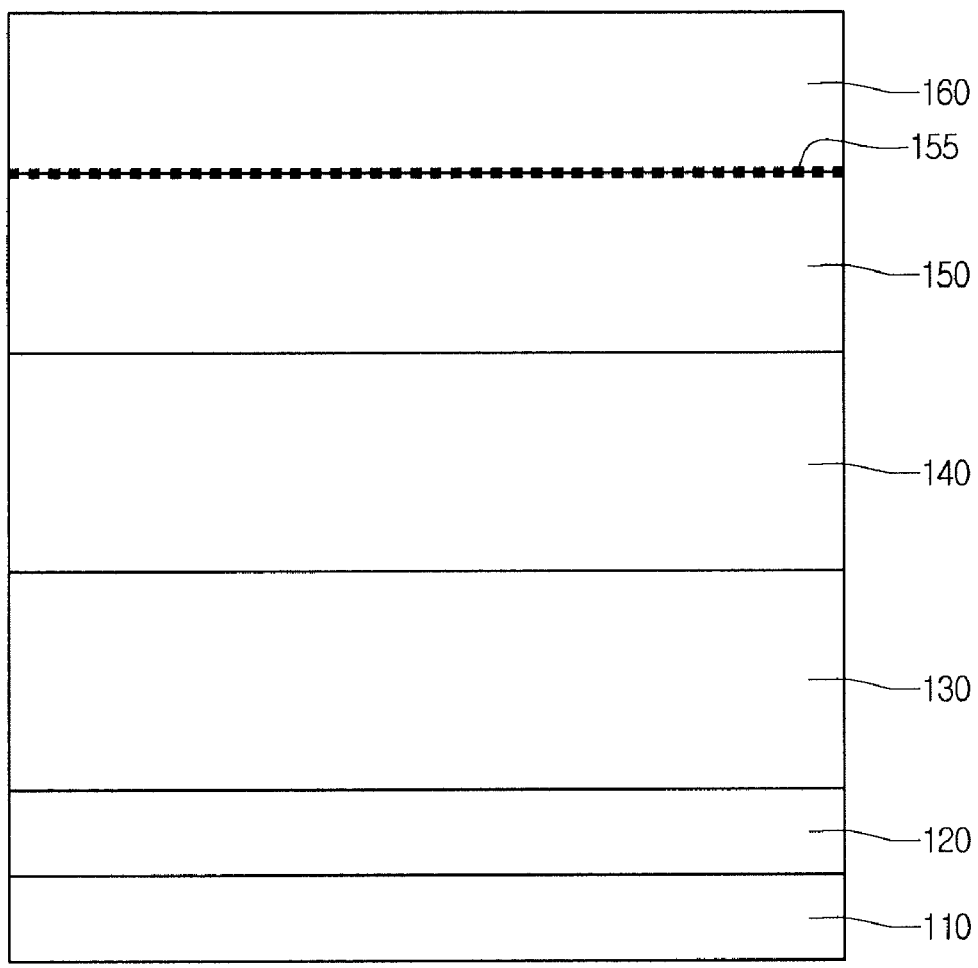
FIG. 1 is a side sectional view of a semiconductor light emitting device according to a first embodiment.

FIG. 1 is a side sectional view of a semiconductor light emitting device according to a first embodiment.

Referring to FIG. 1, the semiconductor light emitting device 100 comprises a substrate 110, a buffer layer 120, a first conductive type semiconductor layer 130, an active layer 140, an undoped semiconductor layer 150, a delta-doped layer 155, and a second conductive type semiconductor layer 160.

The substrate 110 may be made of one selected from the group consisting of sapphire ($Al_2O_3$), GaN, SiC, ZnO, Si, GaP, GaAs and InP, or may comprise a conductive substrate. However, the material of the substrate 110 is not limited to the aforementioned examples. The substrate 110 may have an irregular surface pattern.

A nitride semiconductor is grown on the substrate 110. The growth of the nitride semiconductor may be performed by an e-beam evaporator, a PVD (Physical vapor deposition) equipment, a CVD (Chemical vapor deposition) equipment, a PLD (Plasma laser deposition) equipment, a dual-type thermal evaporator, a sputter, an MOCVD (Metal organic chemical vapor deposition) equipment or the like, but the present invention is not limited thereto.

The buffer layer 120 may be formed on the substrate 110. The buffer layer 120 is a layer to decrease a difference in lattice constant from the substrate 110, and may be selectively formed of GaN, AlN, AlGaN, InGaN or the like.

An undoped GaN layer (not shown) may be formed on the buffer layer 120. The undoped GaN layer may be used as a substrate on which a nitride semiconductor is grown. At least one of the buffer layer 120 and the undoped semiconductor layer may be formed or both of the buffer layer 120 and the undoped semiconductor layer may not be formed. However, the present invention is not limited thereto.

The first conductive type semiconductor layer 130 is formed on the buffer layer 120. The first conductive type semiconductor layer 130 may function as a first electrode contact layer and is doped with a first conductive type dopant. The first conductive type semiconductor layer 130 may be an N-type semiconductor layer, which is a III-V compound and may be formed of a semiconductor material having a composition formula of $In_xAl_yGa_{1-x-y}N$ ($0 \leq x \leq 1$, $0 \leq y \leq 1$, $0 \leq x+y \leq 1$). For example, the N-type semiconductor layer may be formed of at least one selected from the group consisting of GaN, InN, AlN, InGaN, AlGaN, InAlGaN, and AlInN. The first conductive type dopant is an N-type dopant, which comprises Si, Ge and Sn.

Alternatively, a dopant-doped semiconductor layer may be further formed between the buffer layer 120 and the first conductive type semiconductor layer 130, but the present invention is not limited thereto.

The active layer 140 comprising a single quantum well structure or a multiple quantum well structure is formed on the first conductive type semiconductor layer 130. The active layer 140 may be formed in a structure in which InGaN well layers and AlGaN barrier layers are alternated or in a structure in which InGaN well layers and GaN barrier layers are alternated, and these light emitting materials may be changed according to light emitting wavelengths, such as blue wavelength, red wavelength, green wavelength, etc.

A conductive cladding layer (not shown) may be formed on or/and under the active layer 140, and may be an AlGaN layer.

The undoped semiconductor layer 150 may be formed on the active layer 140, the delta-doped layer 155 may be formed on the undoped semiconductor layer 150, and the second conductive type semiconductor layer 160 may be formed on the delta-doped layer 155.

The undoped semiconductor layer 150 may be, for example, an undoped GaN layer. The undoped semiconductor layer 150 protects the active layer 140 from a second conductive type dopant.

The undoped GaN layer exemplified as the undoped semiconductor layer 150 may be, for example, grown in a crystal growth chamber in a thickness of 5~200 Å by supplying gas sources of $NH_3$ and TMGa (or TEGa) at a growing temperature of 700-1000° C. Herein, the growth temperature of the undoped semiconductor layer 150 may be set to a temperature range that can minimize a thermal damage to the active layer 140.

An undoped $Al_yGaN$ layer ($0<y<0.5$) may be grown on the undoped semiconductor layer 150. The undoped $Al_yGaN$ layer ($0<y<0.5$) is formed to prevent an operating voltage from being elevated, and is formed by supplying gas sources of $NH_3$, TMGa (or TEGa) and TMAl.

The delta-doped layer 155 may be formed at a thickness of 1~2 atomic layers (ex: 0.2~0.5 nm) by delta-doping a second conductive type dopant. The second conductive type dopant may comprise a P-type dopant, and the P-type dopant may comprise at least one selected from the group consisting of Mg, Zn, Ca, Sr and Ba.

The delta-doped layer 155 may be grown using Mg dopant. For example, an Mg delta-doped layer is grown by stopping the supply of a gas source of trimethylgalium (TMGa) (or TEGa), exhausting the TMGa (or TEGa) gas to an outside, and supplying hydrogen gas, ammonia gas, and Cp2Mg (which is a source gas for Mg) for 5~30 seconds into a crystal growth chamber. The delta-doped layer 155 is formed by delta-doping the P-type dopant at a growth temperature of 700~1000° C.

The undoped semiconductor layer 150 formed under the delta-doped layer 155 can prevent the delta-doped second conductive type dopant from being out-diffused, thereby preventing the surface characteristics of the active layer 140 from being lowered.

The second conductive type semiconductor layer 160 is doped with a second conductive type dopant, and functions as a second electrode contact layer. The second conductive type semiconductor layer 160 may be formed of a P-type semiconductor layer, which is a III-V compound semiconductor having a composition formula of $In_xAl_yGa_{1-x-y}N$ ($0 \leq x \leq 1$, $0 \leq y \leq 1$, $0 \leq x+y \leq 1$). For example, the P-type semiconductor layer may be formed of at least one selected from the group consisting of GaN, InN, AlN, InGaN, AlGaN, InAlGaN, and AlInN. The second conductive type dopant is a P-type dopant, which comprises Mg, Zn, Ca, Sr, and Ba.

A hole concentration of the second conductive type semiconductor layer 160 may be increased by the delta-doped layer 155 to improve the conductivity of the second conductive type semiconductor layer 160. Accordingly, the operating voltage of the light emitting device can be decreased and the optical characteristic can be improved. The second conductive type semiconductor layer 160 may be formed at a carrier concentration of more than $1~9 \times 10^{18}/cm^3$. Also, the delta-doped layer 155 can suppress a dislocation defect to improve the crystallinity of the semiconductor layer.

The second conductive type semiconductor layer 160 region may comprise the delta-doped layer, or may comprise the undoped semiconductor layer 150 and the delta-doped layer 155. That is, if the second conductive type semiconductor layer 160 is not limited to the function as the electrode contact layer, the second conductive type semiconductor layer 160 may selectively comprise the layers on the active layer 140. However, the present invention is not limited thereto.

A transparent electrode layer (not shown) or/and a third conductive type semiconductor layer (not shown) may be formed on the second conductive type semiconductor layer 160. The third conductive type semiconductor layer may be, for example, an N-type semiconductor layer. While the embodiment exemplarily describes that the first semiconductor layer 130 is the N-type semiconductor layer and the second conductive type semiconductor layer 160 is the P-type semiconductor layer, the reverse is also possible. The embodiment may comprise any one of a P-N junction structure, an N-P junction structure, an N-P-N junction structure, and a P-N-P junction structure.

Figure 2:
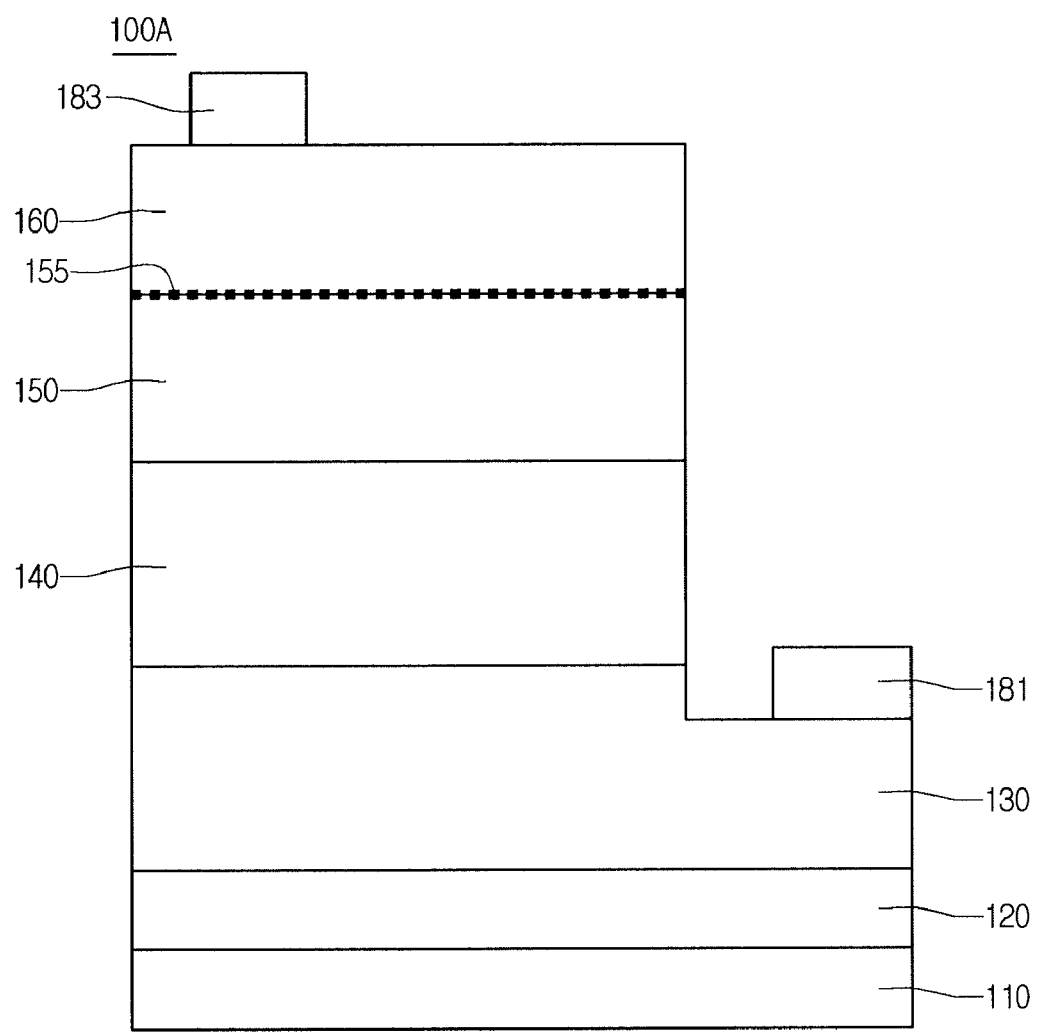
FIG. 2 is a side sectional view of a lateral type semiconductor light emitting device using FIG. 1.

FIG. 2 is a side sectional view of a lateral type semiconductor light emitting device using FIG. 1. In the description of FIG. 2, the repetitive description for the same elements as those of FIG. 1 will be omitted.

Referring to FIG. 2, the lateral type semiconductor light emitting device 100A comprises a first electrode layer 181 formed on the first conductive semiconductor layer 130. A second electrode layer 183 is formed on the second conductive type semiconductor layer 160. Herein, a transparent electrode layer (not shown) and a second electrode layer 183 may be formed on the second conductive type semiconductor layer 160.

The first conductive type semiconductor layer 130 is exposed by a mesa etching process, and the first electrode layer 181 may be formed on the exposed first conductive type semiconductor layer 130.

When a forward bias is applied to the first electrode layer 181 and the second electrode layer 183, the number of holes injected into the active layer 140 from the second conductive type semiconductor layer 160 and the delta-doped layer 155 increases, so that the inner quantum efficiency of the active layer 140 can be improved.

Figure 3:
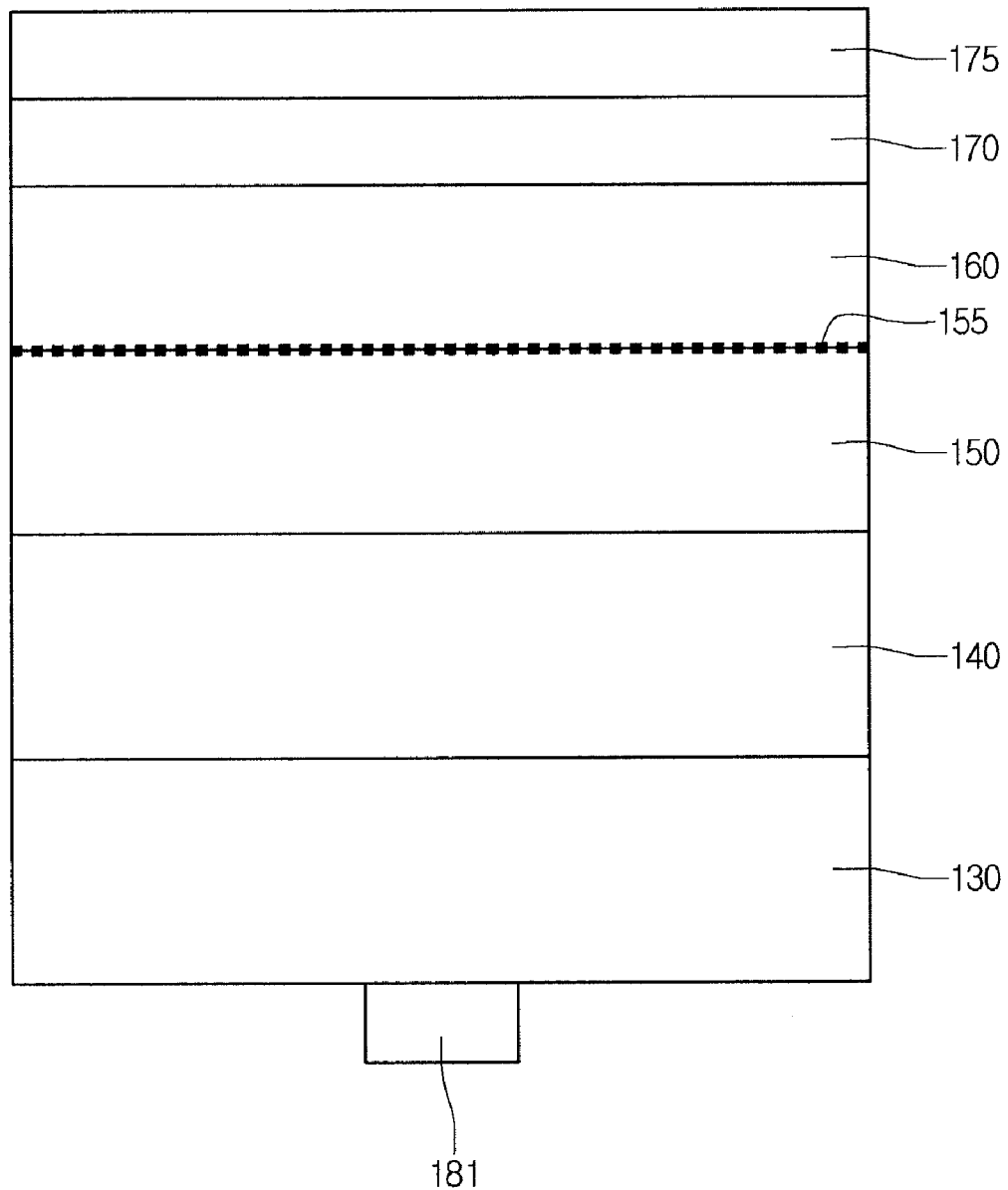
FIG. 3 is a side sectional view of a vertical type semiconductor light emitting device using FIG. 1.

FIG. 3 is a side sectional view of a vertical type semiconductor light emitting device using FIG. 1. In the description of FIG. 3, the repetitive description for the same elements as those of FIG. 1 will be omitted.

Referring to FIG. 3, the vertical type semiconductor light emitting device 100B comprises a reflective electrode layer 170 on the second conductive type semiconductor layer 160, and a conductive supporting substrate 175 on the reflective electrode layer 170. The reflective electrode layer 170 may be selectively formed of Al, Ag, Pd, Rh or Pt, and the conductive supporting substrate 175 may be formed of Cu or Au. However, the present invention is not limited thereto.

The substrate 110 and the buffer layer 120 shown in FIG. 1 are removed by a physical or/and chemical method. In the physical method, a laser beam having a predetermined wavelength is irradiated onto the substrate 110 to separate the substrate 110, and the buffer layer 120 may be removed by a wet or dry etching. In the chemical method, an etchant may be injected into the buffer layer 120 to separate the substrate 110. The buffer layer 120 may be removed by a chemical etching. A first electrode layer 181 may be formed under the first conductive type semiconductor layer 130.

Figure 4:
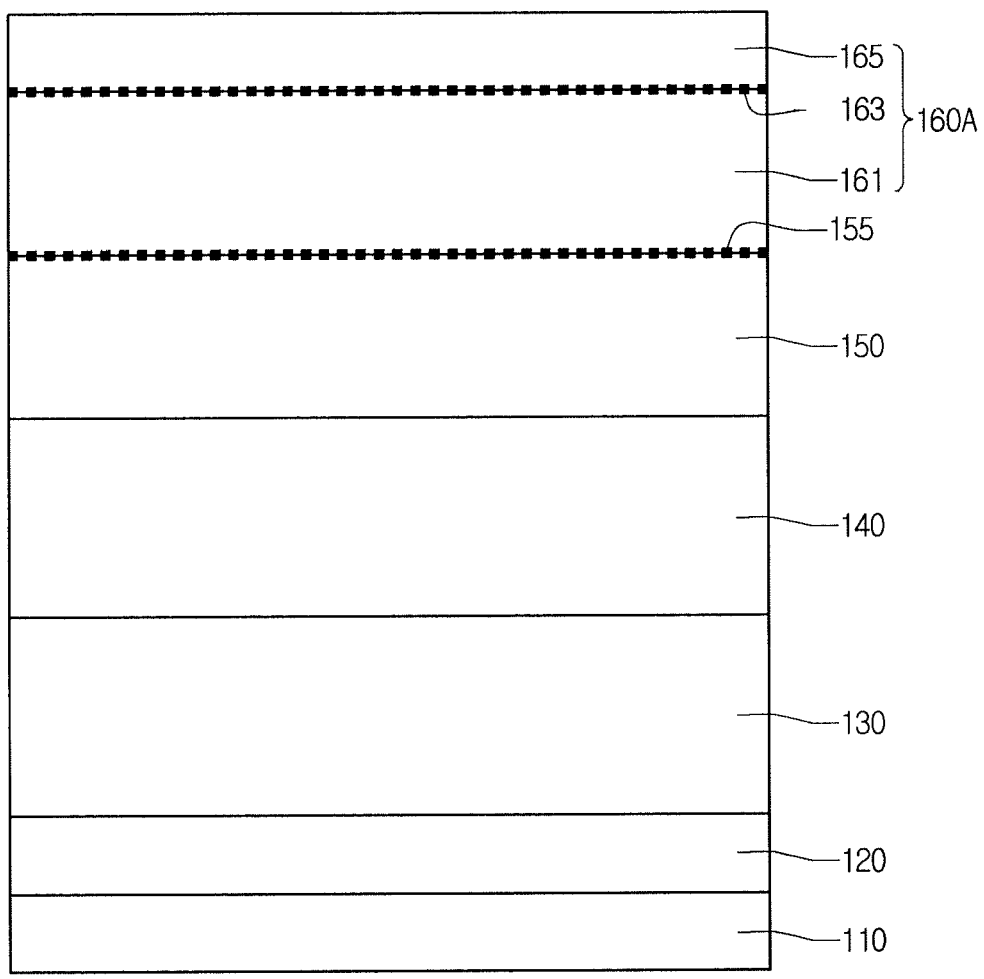
FIG. 4 is a side sectional view of a semiconductor light emitting device according to a second embodiment.

FIG. 4 is a side sectional view of a semiconductor light emitting device according to a second embodiment. In the first and second embodiments, like reference numbers will be used to refer to like parts. The same parts as those of the first embodiment will not be described in this embodiment.

Referring to FIG. 4, the semiconductor light emitting device 102 comprises a substrate 110, a buffer layer 120, a first conductive type semiconductor layer 130, an active layer 140, an undoped semiconductor layer 150, a first delta-doped layer 155, and a second conductive type semiconductor layer 160A.

The undoped semiconductor layer 150 may be, for example, an undoped GaN layer. The undoped semiconductor layer 150 protects the active layer 140 from a delta-doped second conductive type dopant.

A method for growing the undoped GaN layer exemplified as the undoped semiconductor layer 150 is the same as that of the first embodiment, and their repetitive description will be omitted. The undoped semiconductor layer 150 may be formed in a thickness of 5~200 Å. An undoped $Al_yGaN$ layer (0<y<0.5) may be grown on the undoped semiconductor layer 150, and can prevent the operating voltage from being elevated.

The first delta-doped layer 155 is similar to the delta-doped layer of the first embodiment, and accordingly its concrete description will be omitted. The first delta-doped layer 155 may be formed at a thickness of 1~2 atomic layers (ex: 0.2~0.5 nm) by delta-doping a second conductive type dopant. The second conductive type dopant may comprise a P-type dopant, and the P-type dopant may comprise at least one selected from the group consisting of Mg, Zn, Ca, Sr and Ba.

The undoped semiconductor layer 150 formed under the first delta-doped layer 155 can prevent the delta-doped second conductive type dopant from being out-diffused, thereby preventing the surface characteristics of the active layer 140 from being lowered.

The second conductive type semiconductor layer 160A comprises a first nitride semiconductor layer 161, a second delta-doped layer 163, and a second nitride semiconductor layer 165. Herein, the second conductive semiconductor layer 160A may be defined as comprising the undoped semiconductor layer 150 to the second nitride semiconductor layer 165. However, the present invention is not limited thereto.

The first nitride semiconductor layer 161 may be realized by a second conductive type formed on the first delta-doped layer 155. The first nitride semiconductor layer 161 may be formed in a superlattice structure of a second conductive type AlGaN layer or a second conductive type AlGaN/GaN layer, and the second conductive type AlGaN/GaN layer may be formed in 1 to 10 periods.

The first nitride semiconductor layer 161 comprises a second conductive type dopant. The second conductive type dopant is a P-type dopant, which comprises Mg, Zn, Ca, Sr, or Ba. The first nitride semiconductor layer 161 may be formed at a thickness of 5~200 Å.

The second delta-doped layer 163 is formed on the first nitride semiconductor layer 161. The second delta-doped layer 163 may be formed at a thickness of 1~2 atomic layers (ex: 0.2~0.5 nm) by delta-doping a second conductive type dopant. The second conductive type dopant may comprise a P-type dopant, and the P-type dopant may comprise at least one selected from the group consisting of Mg, Zn, Ca, Sr and Ba.

The second delta-doped layer 163 may be grown using Mg dopant. For example, an Mg delta-doped layer is grown by stopping the supply of a gas source of trimethylgalium (TMGa) (or TEGa), exhausting the TMGa (or TEGa) gas to an outside, and supplying hydrogen gas, ammonia gas, and Cp2Mg (which is a source gas for Mg) for 5~30 seconds into a crystal growth chamber. The second delta-doped layer 163 is formed by delta-doping the P-type dopant at a growth temperature of 700~1000° C.

The second nitride semiconductor layer 165 is formed on the second delta-doped layer 163. The second nitride semiconductor layer 165 may be formed of a P-type semiconductor layer, which is a III-V compound semiconductor having a composition formula of $In_xAl_yGa_{1-x-y}N$ (0≦x≦1, 0≦y≦1, 0≦x+y≦1). The second conductive type dopant is a P-type dopant, and the P-type dopant may comprise Mg, Zn, Ca, Sr, or Ba.

A hole concentration of the second conductive type semiconductor layer 160A may be increased by the first and second delta-doped layers 155 and 163 to improve the conductivity of the second conductive type semiconductor layer 160A. Accordingly, the operating voltage of the light emitting device can be decreased and the optical characteristic can be improved. The second conductive type semiconductor layer 160A may be formed at a carrier concentration of more than $1{\sim}9{\times}10^{18}/cm^3$.

Also, a third delta-doped layer (not shown) may be formed in the second conductive type semiconductor layer 160A. The third delta-doped layer may be formed under a second electrode contact layer, and a concrete description on the third delta-doped layer will be omitted.

By arranging the first and second delta-doped layers 155 and 163 between the second nitride semiconductor layer 165 and the undoped semiconductor layer 150, the conductivity of the second conductive type semiconductor layer 160A can be improved, and a dislocation defect can be suppressed to improve the crystallinity. Also, the frequency of the delta doping is proportional to the hole concentration. Accordingly, an increase in the frequency of the delta doping can decrease the operating voltage and improve the optical characteristic. Moreover, the frequency of the delta doping may be limited to a degree that does not deteriorate the quality of the P-type semiconductor layer.

A transparent electrode layer (not shown) or/and a third conductive type semiconductor layer (not shown) may be formed on the second conductive type semiconductor layer 160A. The third conductive type semiconductor layer may be, for example, an N-type semiconductor layer. While the embodiment exemplarily describes that the first semiconductor layer 130 is the N-type semiconductor layer and the second conductive type semiconductor layer 160 is the P-type semiconductor layer, the reverse is also possible. The embodiment may comprise any one of a P-N junction structure, an N-P junction structure, an N-P-N junction structure, and a P-N-P junction structure.

Figure 5:
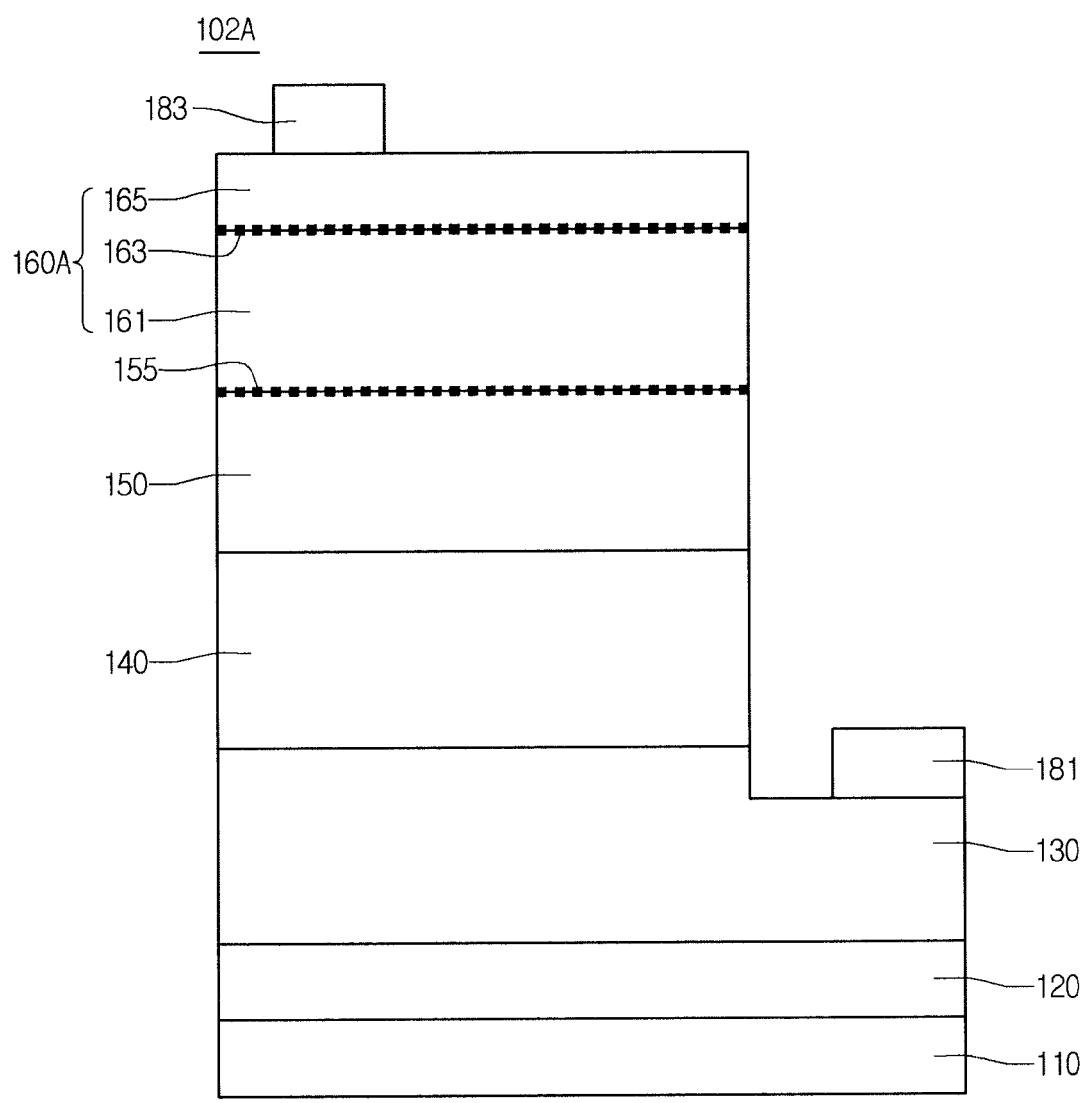
FIG. 5 is a side sectional view of a lateral type semiconductor light emitting device using FIG. 4.

FIG. 5 is a side sectional view of a lateral type semiconductor light emitting device using FIG. 4. In the description of FIG. 5, the repetitive description for the same elements as those of FIG. 4 will be omitted.

Referring to FIG. 5, the lateral type semiconductor light emitting device 102A comprises a first electrode layer 181 formed on the first conductive semiconductor layer 130. A second electrode layer 183 is formed on a second nitride semiconductor layer 165 of the second conductive type semiconductor layer 160A. Herein, a transparent electrode layer (not shown) and a second electrode layer 183 may be formed on the second nitride semiconductor layer 165.

The first conductive type semiconductor layer 130 is exposed by a mesa etching process, and the first electrode layer 181 may be formed on the exposed first conductive type semiconductor layer 130.

When a forward bias is applied to the first electrode layer 181 and the second electrode layer 183, the number of holes injected into the active layer 140 from the second conductive type semiconductor layer 160A and the first and second delta-doped layers 155 and 163 increases, so that the inner quantum efficiency of the active layer 140 can be improved.

Figure 6:
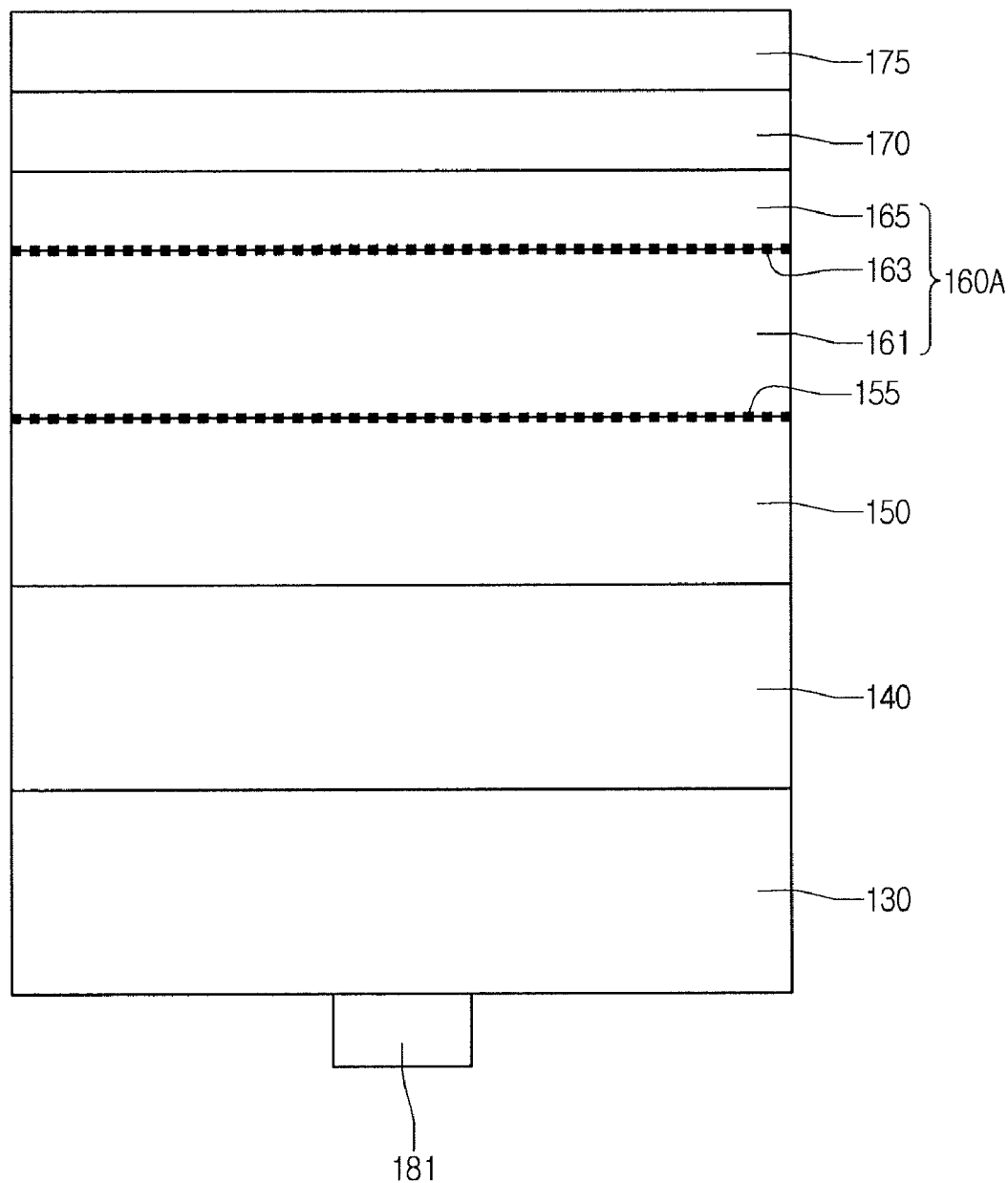
FIG. 6 is a side sectional view of a vertical type semiconductor light emitting device using FIG. 4.

FIG. 6 is a side sectional view of a vertical type semiconductor light emitting device using FIG. 4. In the description of FIG. 6, the repetitive description for the same elements as those of FIG. 4 will be omitted.

Referring to FIG. 6, the vertical type semiconductor light emitting device 102B comprises a reflective electrode layer 170 on the second nitride semiconductor layer 165 of the second conductive type semiconductor layer 160A, and a conductive supporting substrate 175 on the reflective electrode layer 170. The reflective electrode layer 170 may be selectively formed of Al, Ag, Pd, Rh or Pt, and the conductive supporting substrate 175 may be formed of Cu or Au. However, the present invention is not limited thereto.

The substrate 110 and the buffer layer 120 shown in FIG. 4 are removed by a physical or/and chemical method. In the physical method, a laser beam having a predetermined wavelength is irradiated onto the substrate 110 to separate the substrate 110, and the buffer layer 120 may be removed by a wet or dry etching. In the chemical method, an etchant may be injected into the buffer layer 120 to separate the substrate 110. The buffer layer 120 may be removed by a chemical etching. A first electrode layer 181 may be formed under the first conductive type semiconductor layer 130.

In the embodiments, the active layer 140 is protected by the undoped semiconductor layer 150, and at least one delta-doped layers 155, 163 using a P-type dopant may be formed on the undoped semiconductor layer 150. Accordingly, the hole concentration of the P-type semiconductor layer can be improved and the dislocation defect can be suppressed to improve the conductivity. Also, the electrical and optical efficiencies of the semiconductor light emitting device can be improved.

In the description of embodiments, it will be understood that when a layer (or film), region, pattern or structure is referred to as being 'on' another layer (or film), region, pad or pattern, the terminology of 'on' and 'under' comprises both the meanings of 'directly on and under' and 'indirectly on and under'. Further, the reference about 'on' and 'under' each layer will be made on the basis of drawings. Also, the thickness of each layer in the drawings is an example, and is not limited thereto.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a n-type semiconductor layer including a semiconductor material having a composition formula of $In_xAl_yGa_{1-x-y}N$ ($0 \leq x \leq 1$, $0 \leq y \leq 1$, $0 \leq x+y \leq 1$);
a delta-doped layer on the n-type semiconductor layer;
an active layer on the delta-doped layer; and
a p-type semiconductor layer on the active layer,
wherein the p-type semiconductor layer is formed of a semiconductor material having a composition formula of $In_xAl_yGa_{1-x-y}N$ ($0 \leq x \leq 1$, $0 \leq y \leq 1$, $0 \leq x+y \leq 1$).

2. The light emitting device according to claim 1, wherein the p-type semiconductor layer is on a buffer layer, and the buffer layer is on a substrate.

3. The light emitting device according to claim 1, wherein the delta-doped layer comprises a first delta-doped layer and a second delta-doped layer.

4. The light emitting device according to claim 1, further comprising:
a supper lattice layer between the delta-doped layer and the active layer.

5. The light emitting device according to claim 1, further comprising:
a p-type AlGaN semiconductor layer between the active layer and the p-type semiconductor layer.

* * * * *